(12) United States Patent
Kato et al.

(10) Patent No.: US 8,912,660 B2
(45) Date of Patent: Dec. 16, 2014

(54) ESD PROTECTION DEVICE

(71) Applicant: Murata Manufacturing Co., Ltd., Nagaokakyo (JP)

(72) Inventors: Noboru Kato, Nagaokakyo (JP); Jun Sasaki, Nagaokakyo (JP); Kosuke Yamada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 127 days.

(21) Appl. No.: 13/762,417

(22) Filed: Feb. 8, 2013

(65) Prior Publication Data

US 2013/0168837 A1 Jul. 4, 2013

Related U.S. Application Data

(63) Continuation of application No. PCT/JP2011/067123, filed on Jul. 27, 2011.

(30) Foreign Application Priority Data

Aug. 18, 2010 (JP) .................. 2010-183317

(51) Int. Cl.
| | | |
|---|---|---|
| H01L 23/48 | (2006.01) | |
| H01L 23/44 | (2006.01) | |
| H01L 23/60 | (2006.01) | |
| H01L 27/02 | (2006.01) | |
| H01L 23/00 | (2006.01) | |
| H01L 23/525 | (2006.01) | |
| H01L 23/31 | (2006.01) | |

(52) U.S. Cl.
CPC ....... *H01L 23/60* (2013.01); *H01L 2224/05611* (2013.01); *H01L 2224/0235* (2013.01);
(Continued)

(58) Field of Classification Search
CPC ......... H01L 23/60; H01L 24/05; H01L 24/13; H01L 23/481; H01L 24/14; H01L 24/06; H01L 2224/0401; H01L 2224/81191; H01L 24/81
See application file for complete search history.

(56) References Cited

U.S. PATENT DOCUMENTS 6,140,155 A 10/2000 Mihara et al.
6,596,560 B1 * 7/2003 Hsu ............................ 438/108
(Continued)

FOREIGN PATENT DOCUMENTS

JP 04-146660 A 5/1992
JP 2000-195890 A 7/2000
(Continued)

OTHER PUBLICATIONS

Official Communication issued in International Patent Application No. PCT/JP2011/067123, mailed on Aug. 23, 2011.
(Continued)

*Primary Examiner* — Alonzo Chambliss
(74) *Attorney, Agent, or Firm* — Keating & Bennett, LLP

(57) ABSTRACT

An ESD protection device includes a semiconductor substrate including input/output electrodes and a rewiring layer located on the top surface of the semiconductor substrate. An ESD protection circuit is provided in the top layer of the semiconductor substrate, and the input/output electrodes are connected to the ESD protection circuit. The rewiring layer includes interlayer wiring lines, in-plane wiring lines, and post-shaped electrodes. First ends of the interlayer wiring lines provided in the thickness direction are connected to the input/output electrodes provided on the top surface of the semiconductor substrate and the second ends are connected to first ends of the in-plane wiring lines extending in the plane direction. The distance between the centers of the first and second post-shaped electrodes is larger than the distance between the centers of the first and second input/output electrodes.

20 Claims, 8 Drawing Sheets

(52) U.S. Cl.
CPC .......... *H01L 2924/01029* (2013.01); *H01L 2924/01033* (2013.01); *H01L 2224/02331* (2013.01); *H01L 24/13* (2013.01); *H01L 2224/05644* (2013.01); *H01L 2224/05562* (2013.01); *H01L 2924/01006* (2013.01); *H01L 2224/05016* (2013.01); *H01L 2224/02371* (2013.01); *H01L 2224/05568* (2013.01); *H01L 2924/01078* (2013.01); *H01L 2924/01079* (2013.01); *H01L 2224/81815* (2013.01); *H01L 2924/014* (2013.01); *H01L 23/525* (2013.01); *H01L 24/16* (2013.01); *H01L 2224/0401* (2013.01); *H01L 2924/01013* (2013.01); *H01L 2224/05548* (2013.01); *H01L 2224/05155* (2013.01); *H01L 24/81* (2013.01); *H01L 2224/131* (2013.01); *H01L 2924/0105* (2013.01); *H01L 27/0255* (2013.01); *H01L 2224/14131* (2013.01); *H01L 24/05* (2013.01); *H01L 2224/81191* (2013.01); *H01L 2224/02379* (2013.01); *H01L 2224/02375* (2013.01); *H01L 2224/16238* (2013.01); *H01L 23/3114* (2013.01); *H01L 2924/01004* (2013.01); *H01L 2224/05026* (2013.01); *H01L 2924/01005* (2013.01); *H01L 2224/81192* (2013.01); *H01L 2224/05024* (2013.01); *H01L 2224/02377* (2013.01); *H01L 27/0296* (2013.01)
USPC .......... 257/774; 257/775; 257/786; 438/613; 438/638; 438/640

(56) References Cited

U.S. PATENT DOCUMENTS

| | | | | |
|---|---|---|---|---|
| 8,241,963 | B2 * | 8/2012 | Shen et al. | 438/121 |
| 8,319,354 | B2 * | 11/2012 | Lin et al. | 257/781 |
| 8,558,383 | B2 * | 10/2013 | Lin et al. | 257/758 |
| 2001/0019496 | A1 | 9/2001 | Wang | |
| 2004/0094841 | A1 | 5/2004 | Matsuzaki et al. | |
| 2005/0253264 | A1 | 11/2005 | Aiba et al. | |
| 2008/0265413 | A1 * | 10/2008 | Chou et al. | 257/737 |
| 2010/0155962 | A1 | 6/2010 | Inoue et al. | |
| 2013/0099353 | A1 * | 4/2013 | Kato et al. | 257/531 |

FOREIGN PATENT DOCUMENTS

| | | | |
|---|---|---|---|
| JP | 2002-064161 | A | 2/2002 |
| JP | 2004-158758 | A | 6/2004 |
| JP | 2005-327816 | A | 11/2005 |
| JP | 2007-013031 | A | 1/2007 |
| JP | 2010-087113 | A | 4/2010 |
| JP | 2001-244418 | A | 9/2011 |
| WO | 2010/061495 | A1 | 6/2010 |

OTHER PUBLICATIONS

Official Communication issued in corresponding Japanese Patent Application No. 2012-529540, mailed on Jul. 9, 2013.

* cited by examiner

ESD PROTECTION DEVICE

BACKGROUND OF THE INVENTION

1. Field of the Invention

The present invention relates to ESD protection devices that protect, for example, semiconductor ICs from static electricity, and in particular to CSP-type ESD protection devices whose functional portions are provided on silicon substrates.

2. Description of the Related Art

Various electronic apparatuses, such as mobile communication terminals, digital cameras, and notebook PCs include semiconductor integrated circuits (IC chips) that form logic circuits, memory circuits, and the like. Such semiconductor integrated circuits, which are constant-voltage driven circuits formed of fine wiring patterns formed on semiconductor substrates, are in general vulnerable to electrostatic discharges such as surges. Hence, electrostatic discharge (ESD) protection devices are used to protect these semiconductor integrated circuits from electrostatic discharges.

As disclosed in Japanese Unexamined Patent Application Publication No. 4-146660, Japanese Unexamined Patent Application Publication No. 2001-244418, Japanese Unexamined Patent Application Publication No. 2007-013031, and Japanese Unexamined Patent Application Publication No. 2004-158758, ESD protection devices have a configuration in which an ESD protection circuit including a diode is formed in a semiconductor substrate. A protection operation performed by the diode in the ESD protection circuit utilizes a breakdown phenomenon of the diode at the time when a reverse direction voltage is applied, where the breakdown voltage is equal to the operation voltage.

Japanese Unexamined Patent Application Publication No. 2004-158758 discloses an example in which an ESD protection device is formed as a surface mount component. Here, the configuration of the ESD protection device disclosed in Japanese Unexamined Patent Application Publication No. 2004-158758 is described with reference to FIG. 1. FIG. 1 is a cross-sectional view of a semiconductor device that forms the ESD protection device disclosed in Japanese Unexamined Patent Application Publication No. 2004-158758. This semiconductor device includes a silicon substrate (semiconductor substrate) 1. The silicon substrate 1 has an integrated circuit formed thereon in the middle portion of the upper surface and a plurality of connection pads 2 are arranged at the periphery of the upper surface in such a manner as to be connected to the integrated circuit. An insulating film 3 made of silicon oxide is provided on the upper surface of the silicon substrate 1 except for the center portions of the connection pads 2, and the center portions of the connection pads 2 are exposed via openings 4 provided in the insulating film 3.

A protection film (insulating film) 5 made of an organic resin, such as polyimide, is provided on the upper surface of the insulating film 3. Openings 6 are provided in portions of the protection film 5 corresponding to the openings 4 of the insulating film 3. Depressions 7 are provided in rewiring formation regions of the upper surface of the protection film 5. The depressions 7 communicate with the openings 6.

Rewiring lines 8 each formed of an underlying metal layer 8a and an upper layer metal layer 8b provided on the underlying layer 8a are provided in such a manner as to extend from the upper surfaces of the connection pads 2 exposed through the openings 4 and 6 to predetermined portions of the upper surface of the protection film 5 within the depressions 7.

Column electrodes 10 are provided on the upper surfaces of the pad portions of the rewiring lines 8. A sealing film 11 is provided on the upper surface of the protection film 5 including the rewiring lines 8 such that the upper surface of the sealing film 11 and the upper surfaces of the column electrodes form the same plane. The upper surfaces of the column electrodes 10 have solder balls 12 provided thereon.

There is a problem in that when such an ESD protection device is provided in a high-frequency circuit, an influence from the parasitic capacitance of the diode exists. In other words, as a result of an ESD protection device being inserted in a signal line, the impedance is changed due to an influence from the parasitic capacitance of the diode, and this may cause signal loss. Particularly in an ESD protection device used in a high-frequency circuit, the parasitic capacitance needs to be small to prevent the deterioration of the high-frequency characteristics of signal lines connected to the device and an integrated circuit to be protected.

However, an existing ESD protection device such as the one illustrated in FIG. 1 may structurally cause parasitic capacitance to be generated between the electrodes, in addition to the parasitic capacitance of the diode, and this may result in an increase in the capacitance of the ESD protection device itself.

SUMMARY OF THE INVENTION

Preferred embodiments of the present invention provide an ESD protection device that significantly reduces and prevents deterioration of circuit characteristics by reducing the influence of the parasitic capacitance of a diode.

An ESD protection device according to a preferred embodiment of the present invention includes a semiconductor substrate including an ESD protection circuit including a diode, and first and second input/output electrodes electrically connected to the ESD protection circuit, and a rewiring layer including a first post-shaped electrode electrically connected to the first input/output electrode and a first terminal electrode and a second post-shaped electrode electrically connected to the second input/output electrode and a second terminal electrode, wherein a distance between centers of the first and second post-shaped electrodes is larger than a distance between centers of the first and second input/output electrodes.

For example, a minimum distance between the first and second post-shaped electrodes preferably is larger than the distance between the centers of the first and second input/output electrodes.

The rewiring layer includes first and second in-plane wiring lines disposed within an inner layer and first and second interlayer wiring lines respectively connecting the first and second in-plane wiring lines to the first and second input/output electrodes, the first post-shaped electrode connects the first in-plane wiring line to the first terminal electrode, and the second post-shaped electrode connects the second in-plane wiring line to the second terminal electrode.

Each of cross-sectional areas of the first and second post-shaped electrodes in planes perpendicular or substantially perpendicular to center axes of the electrodes is preferably larger on the terminal electrode side than on the input/output electrode side.

For example, the first and second post-shaped electrodes preferably have shapes in which the cross-sectional areas thereof increase continuously or stepwise from the input output electrodes toward the terminal electrodes.

In the ESD protection device of a preferred embodiment of the present invention, for example, a first terminal electrode connected to a first signal line and a second terminal electrode connected to a second signal line are provided on the rewiring layer near two respective edge portions defined by a first side and third and fourth sides neighboring the first side, of the semiconductor substrate, a third terminal electrode connected to a power supply line and a fourth terminal electrode connected to a ground line are provided on the rewiring layer near two respective edge portions defined by a second side opposing the first side and third and fourth sides neighboring the second side, of the semiconductor substrate, and the ESD protection circuit is connected between the first terminal electrode and the third terminal electrode, between the first terminal electrode and the fourth terminal electrode, between the second terminal electrode and the third terminal electrode, and between the second terminal electrode and the fourth terminal electrode.

According to various preferred embodiments of the present invention, stray capacitance between post-shaped electrodes can be limited to a minimum and an ESD protection device having a small parasitic capacitance and excellent high-frequency characteristics can be realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

An ESD protection device according to preferred embodiments of the present invention is described with reference to the figures.

Figure 1:
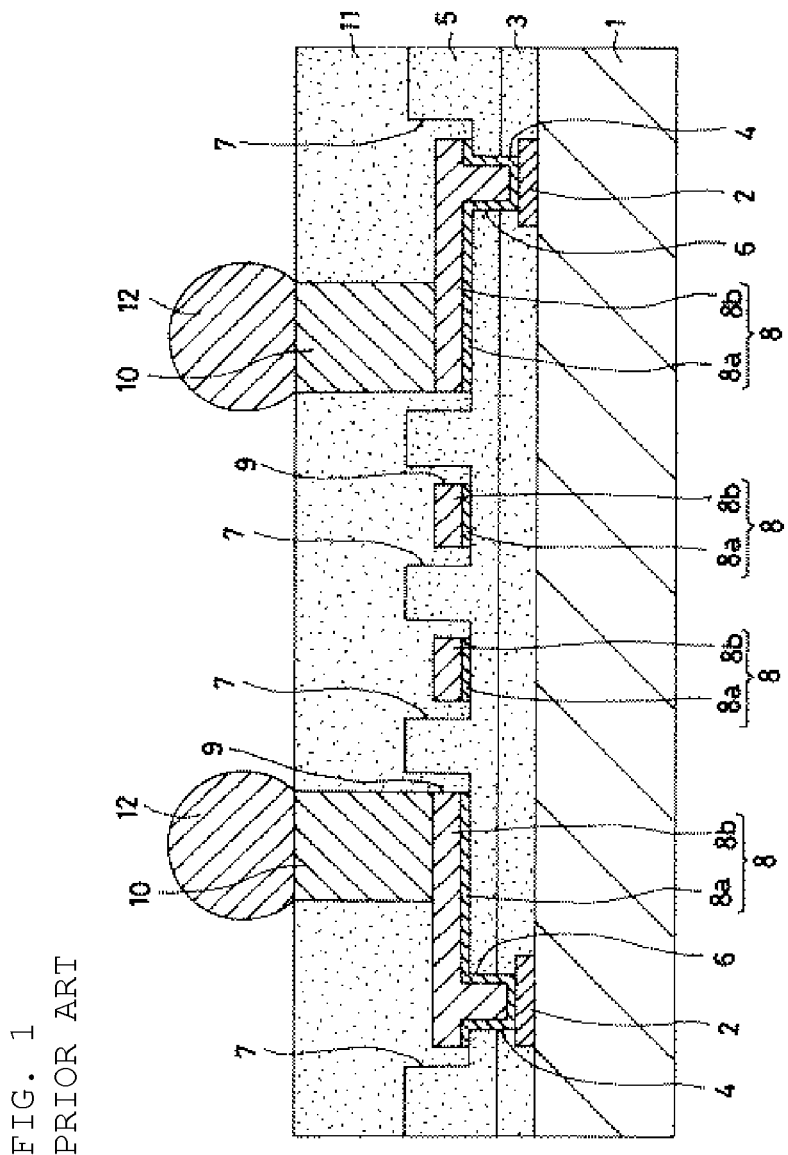
FIG. 1 is a cross-sectional view of a semiconductor device that forms an ESD protection device, disclosed in Japanese Unexamined Patent Application Publication No. 2004-158758
Figure 2A:
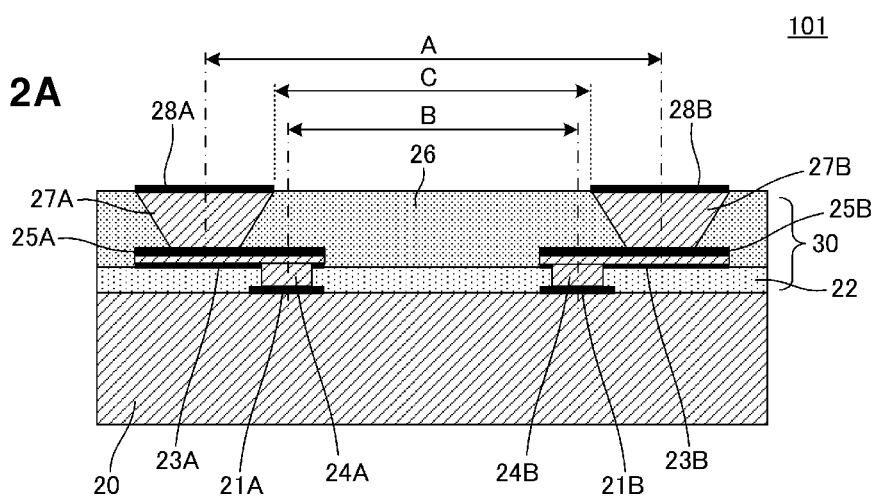
FIG. 2A is a cross-sectional view of the major portions of an ESD protection device 101 according to a first preferred embodiment of the present invention.
Figure 2B:
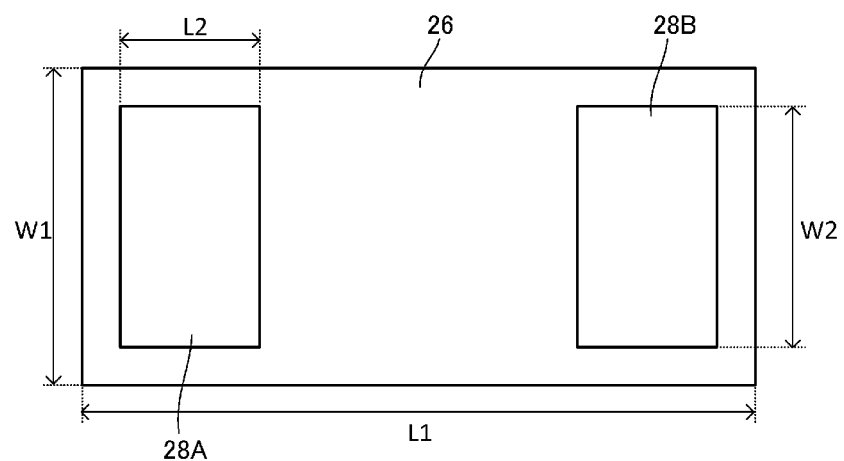
FIG. 2B is a top view of the ESD protection device 101.
Figure 3:
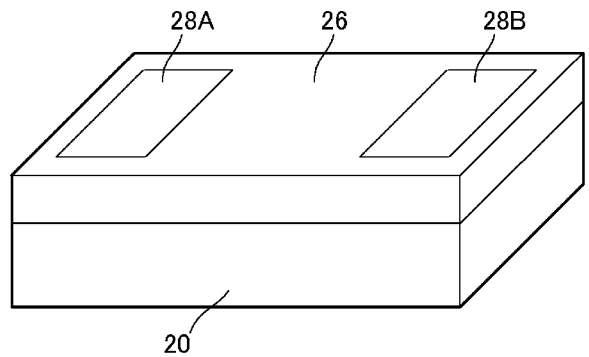
FIG. 3 is a perspective view of the ESD protection device 101.

FIG. 2A is a cross-sectional view of the major portions of an ESD protection device 101 according to the first preferred embodiment. FIG. 2B is a top view of the ESD protection device 101. FIG. 3 is a perspective view of the ESD protection device 101.

Referring to FIG. 2A, the ESD protection device 101 includes a semiconductor substrate 20 including input/output electrodes 21A and 21B, and a rewiring layer 30 provided on the top surface of the semiconductor substrate 20. Although not illustrated in FIG. 2A, an ESD protection circuit is provided in the top layer of the semiconductor substrate 20, and the input/output electrodes 21A and 21B are connected to the ESD protection circuit. The rewiring layer 30 includes interlayer wiring lines 24A and 24B, in-plane wiring lines 25A and 25B, and post-shaped electrodes 27A and 27B.

First ends of the interlayer wiring lines 24A and 24B arranged in the thickness direction are connected to the input/output electrodes 21A and 21B arranged on the top surface of the semiconductor substrate 20, and the second ends are connected to first ends of the in-plane wiring lines 25A and 25B extending in an in-plane direction. The second ends of the in-plane wiring lines 25A and 25B are connected to first ends of the post-shaped electrodes 27A and 27B arranged in the thickness direction.

Referring to FIG. 2B, two rectangular or substantially rectangular terminal electrodes 28A and 28B are located on the upper surface of the ESD protection device 101. In other words, the upper surface of the ESD protection device 101 preferably has a rectangular or substantially rectangular shape including long sides (dimension: L1) and short sides (dimension: W1), and each of the terminal electrodes 28A and 28B also preferably has a rectangular or substantially rectangular shape including long sides (dimension: W2) and short sides (dimension: L2). The short sides of the terminal electrodes 28A and 28B are arranged parallel or substantially parallel with the long sides of the ESD protection device, and the long sides of the terminal electrodes 28A and 28B are arranged parallel or substantially parallel with the end surfaces of the ESD protection device 101.

The ESD protection device 101 includes a diode such as a Schottky barrier diode, which is connected to the input/output electrodes 21A and 21B. The input/output electrodes preferably include aluminum pads (Al pads). A non-organic insulating layer 22 made of $SiO_2$ is arranged on a surface of the semiconductor substrate 20 where the ESD protection circuit is located, and openings are provided in portions of the non-organic insulating layer 22 where the Al pads are arranged. Under bump metal (UBM) layers made of Ti and Cu are provided in and around these openings, and these UBM layers define the interlayer wiring lines 24A and 24B. On the top surfaces of the UBM layers, the in-plane wiring lines 25A and 25B made of Cu are provided. The in-plane wiring lines 25A and 25B extend so as to allow the neighboring post-shaped electrodes 27A and 27B to be arranged farther from each other.

Insulating adhesive layers 23A and 23B preferably made of polyimide are formed between the non-organic insulating layer and the in-plane wiring lines 25A and 25B to enhance the adherence between the UBM layers and the non-organic insulating layer 22.

When the first ends and the second ends of the in-plane wiring lines 25A and 25B are referred to by the first regions and the second regions, the first regions are regions respectively connected to the interlayer wiring lines 24A and 24B, and the second regions are regions respectively connected to the post-shaped electrodes 27A and 27B. The post-shaped electrodes 27A and 27B each preferably are pillar-shaped in an organic insulating film 26, and extend in a direction perpendicular or substantially perpendicular to the main surface of the semiconductor substrate 20.

The first post-shaped electrode 27A and the second post-shaped electrode 27B are preferably arranged such that the distance A between the centers of the two posts is larger than the distance B between the centers of the first input/output electrode 21A and the second input/output electrode 21B.

By making the distance between the first and second post-shaped electrodes 27A and 27B be larger than the distance between the first and second input/output electrodes 21A and 21B in this manner, the stray capacitance between the post-shaped electrodes 27A and 27B can be suppressed to a minimum such that an ESD protection device with a small parasitic capacitance and excellent high-frequency characteristics can be realized.

Further, as a result of the post-shaped electrodes 27A and 27B being arranged so as not to overlap the interlayer wiring lines 24A and 24B in plan view, even when the ESD protection device 101 is directly mounted on a motherboard, such as a printed circuit board, thermal stress from the motherboard or dropping shock becomes unlikely to directly affect the ESD protection device 101.

In the ESD protection device 101, the first and second post-shaped electrodes 27A and 27B are arranged such that the maximum width of the two post-shaped electrodes is larger than the diameter of the first and second interlayer wiring lines 24A and 24B and further the minimum distance C between the post-shaped electrodes 27A and 27B is larger than the distance B between the centers of the input/output electrodes 21A and 21B. As a result of this configuration, a stray capacitance generated between the post-shaped electrodes 27A and 27B can be made to be less than or equal to a stray capacitance generated between the interlayer wiring lines 24A and 24B. Hence, an increase in stray capacitance caused by providing the post-shaped electrodes 27A and 27B is significantly reduced and prevented.

Figure 4A:
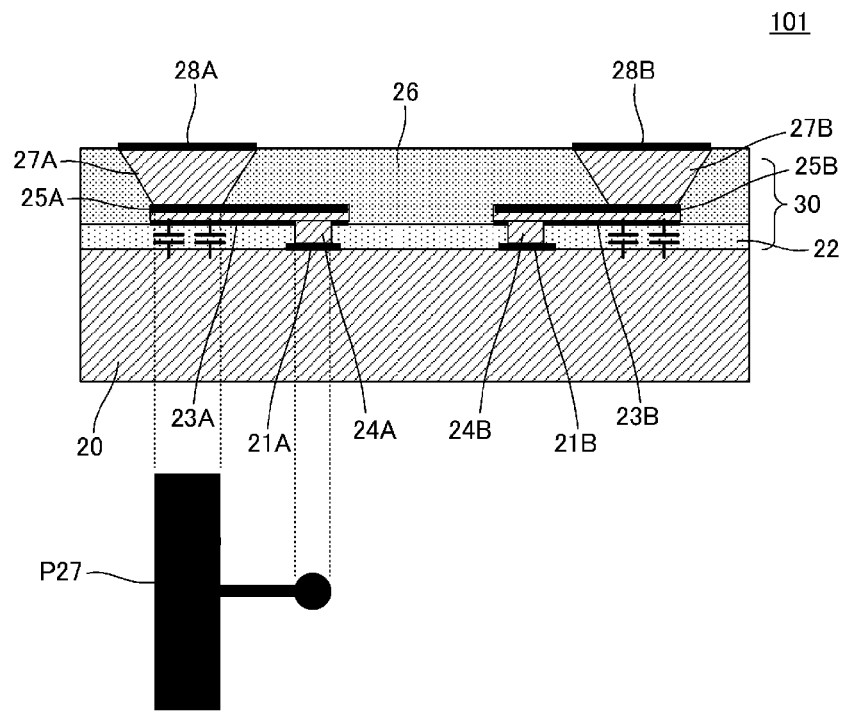
FIGS. 4A and 4B illustrate the dimensions of the post-shaped electrodes and the pads of the in-plane wiring lines regarding the ESD protection device 101 illustrated in FIG. 2A and a comparative example.
Figure 4B:
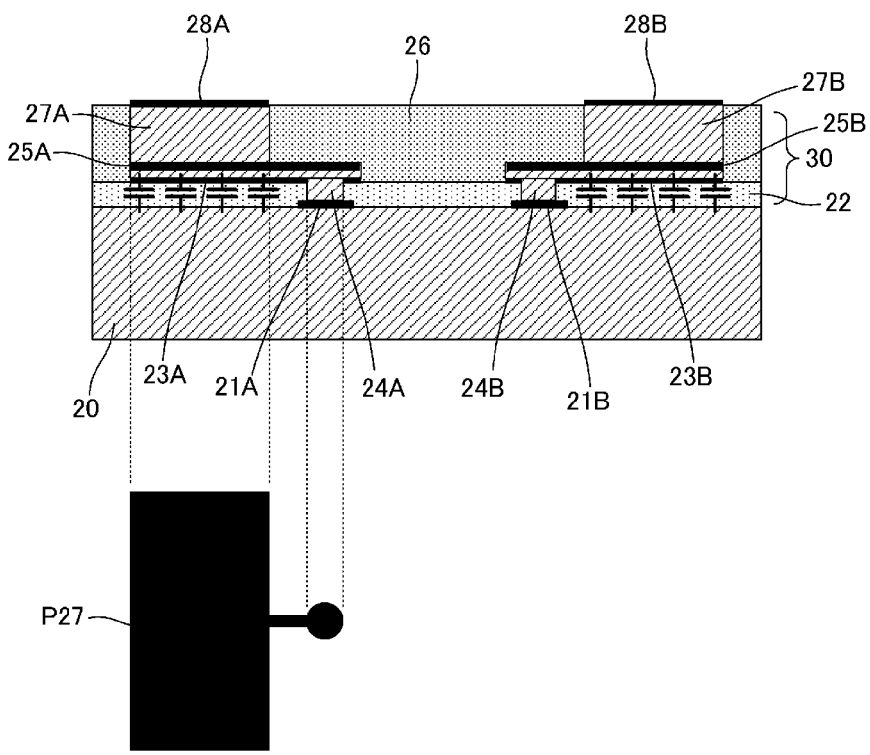

Referring to FIG. 2A, FIG. 2B, and FIG. 3, the area of the post-shaped electrodes 27A and 27B on the in-plane wiring lines 25A and 25B side is small and the area of the post-shaped electrodes 27A and 27B on the terminal electrodes 28A and 28B side is large and, hence, the shape of the post-shaped electrodes in a sectional view taken along a plane parallel or substantially parallel with the direction (thickness direction) in which the post-shaped electrodes extend is that of a trapezoid. The effect of this shape is described with reference to FIGS. 4A and 4B. FIG. 4A illustrates the dimensions of the post-shaped electrodes and the pads of the in-plane wiring lines of the ESD protection device 101 illustrated in FIG. 2A. FIG. 4B illustrates a comparative example.

In the ESD protection device 101 according to the first preferred embodiment, the semiconductor substrate 20 side width of the post-shaped electrodes 27A and 27B is small and the mounting motherboard side width is large. Hence, the size of the in-plane wiring lines 25A and 25B can be made small while ensuring reliable connection with the motherboard. When the size of the in-plane wiring lines 25A and 25B is small, the capacitance generated between the semiconductor substrate 20 and the in-plane wiring lines 25A and 25B (specifically, between the semiconductor substrate 20 and pads P27 of the in-plane wiring lines to which the post-shaped electrodes 27A and 27B are connected) is small and, hence, an ESD protection device with a small parasitic capacitance and excellent high-frequency characteristics is realized.

Since the post-shaped electrodes 27A and 27B preferably have a square cross section (transverse section) in a direction perpendicular or substantially perpendicular to the extending direction thereof, the cross-sectional area of the post-shaped electrodes 27A and 27B can be made large and, hence, the area of a semiconductor substrate can be effectively used. As a result, an ESD protection device, even when decreased in size, can be realized that has highly reliable connection with a motherboard and excellent high-frequency characteristics.

Note that the post-shaped electrodes 27A and 27B may have a shape in which the cross-sectional area thereof is increased stepwise when going from the input/output electrodes 21A and 21B side to the terminal electrodes 28A and 28B side.

The terminal electrodes 28A and 28B side surfaces of the post-shaped electrodes 27A and 27B, i.e., the surfaces to be connected to the motherboard, such as a printed circuit board, are provided with a plated metal film, such as a Ni/Au film or a Ni/Sn film. The plated metal film located on the surface of the post-shaped electrode 27A constitutes the terminal electrode 28A for a signal line, and the plated metal film located on the surface of the post-shaped electrode 27B constitutes the terminal electrode 28B for a ground terminal.

The post-shaped electrodes 27A and 27B preferably include, for example, a plated Cu film, and the plated Ni film defines a diffusion prevention layer between the plated Cu film and plated Au film or a diffusion prevention layer between the plated Cu film and plated Sn film.

Figure 5:
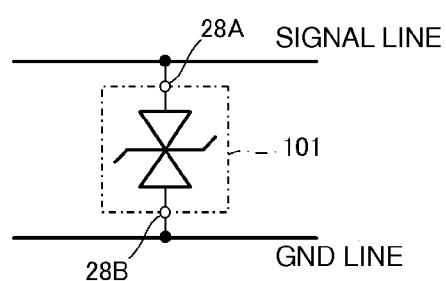
FIG. 5 illustrates an example circuit diagram in which the ESD protection device 101 according to the first preferred embodiment of the present invention is used.
Figure 6:
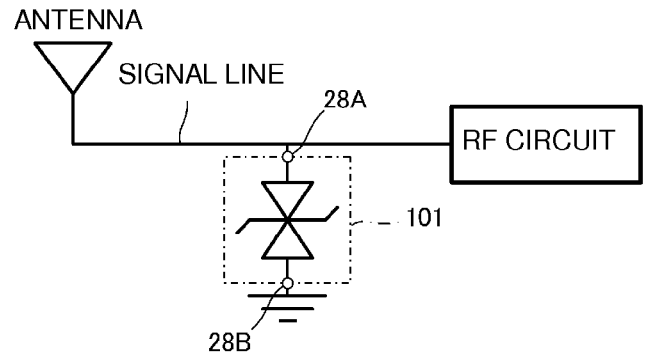
FIG. 6 illustrates an example circuit diagram in which the ESD protection device 101 has been applied to an antenna portion.

FIG. 5 illustrates a non-limiting example circuit diagram in which the ESD protection device 101 according to the first preferred embodiment is used. FIG. 6 illustrates an example circuit diagram in which the ESD protection device 101 has been applied to an antenna portion.

The ESD protection device 101 defines an ESD protection circuit in which two Schottky barrier diodes are connected in series so as to face each other. The ESD protection device 101 is connected between a signal line and a GND line, as illustrated in FIG. 5. For example, in the example illustrated in FIG. 6, the terminal electrode 28A, for a signal line, of the ESD protection device 101 is connected to a signal line and the terminal electrode 28B, for a ground terminal, of the ESD protection device 101 is connected to GND, such that the ESD protection device is inserted between the antenna and an RF circuit. As a result, an ESD transient current input from the antenna is shunted to the ground such that the voltage of the signal line can be clamped at a safe level.

Figure 7A:
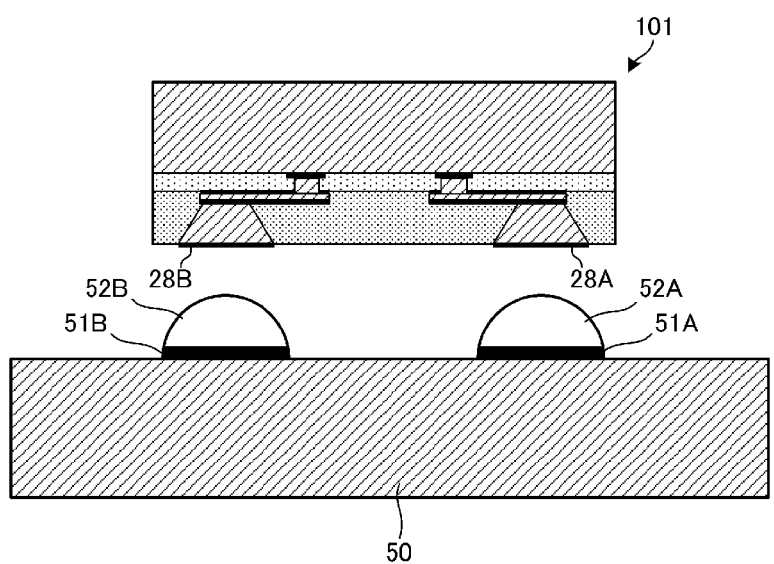
FIG. 7A illustrates the ESD protection device 101 and a configuration of a printed circuit board on which the ESD protection device 101 is to be mounted.
Figure 7B:
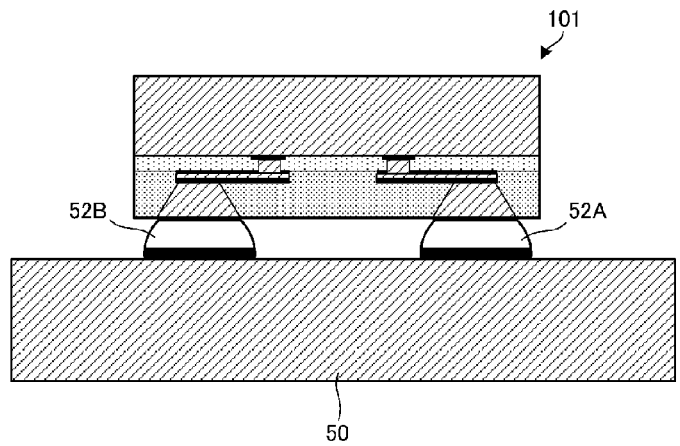
FIG. 7B illustrates a configuration in a state in which the ESD protection device 101 is mounted on the printed circuit board.

FIG. 7A illustrates the ESD protection device 101 and the configuration of a printed circuit board on which the ESD protection device 101 is to be mounted. FIG. 7B illustrates a configuration in a state in which the ESD protection device 101 is mounted on the printed circuit board.

Referring to FIG. 7A and FIG. 7B, the ESD protection device 101 is mounted and fixed to pad electrodes 51A and 51B of a printed circuit board 50 using, for example, a reflow soldering method via solder 52A and 52B arranged on the pad electrodes 51A and 51B. The ESD protection device 101 is an example of the device formed as a single-channel product, and has ESD protection capability for a single signal line.

In this manner, by forming the post-shaped electrodes provided in the rewiring layer 30 each in the shape of a column with a rectangular or substantially rectangular cross section, the inductance components of the post-shaped electrodes can be made large in the signal frequency band and, hence, the parasitic capacitance of the diode of the ESD protection device can be decreased. As a result, a low-loss small and thin ESD protection device with a small parasitic capacitance for high-frequency signals can be realized without degrading the ESD protection capability.

Further, it is preferable to use a configuration in which the conductor portion of the rewiring layer 30 includes the interlayer wiring lines 24A and 24B whose first ends are respectively connected to the input/output electrodes 21A and 21B, the in-plane wiring lines 25A and 25B whose first ends are respectively connected to the second ends of the interlayer wiring lines 24A and 24B, and the post-shaped electrodes 27A and 27B respectively connected to the second ends of the in-plane wiring lines 25A and 25B. Since the degree of freedom in positioning of the post-shaped electrodes 27A and 27B is increased and, hence, the degree of freedom in selecting the shapes thereof is increased.

Referring to FIG. 7A and FIG. 7B, the ESD protection device 101 is mounted on the printed circuit board 50 with the mounting surface thereof facing downward. In the first preferred embodiment described above, the mounting surface side of the ESD protection device 101 preferably is the upper surface side of the ESD protection device 101.

Second Preferred Embodiment

Figure 8A:
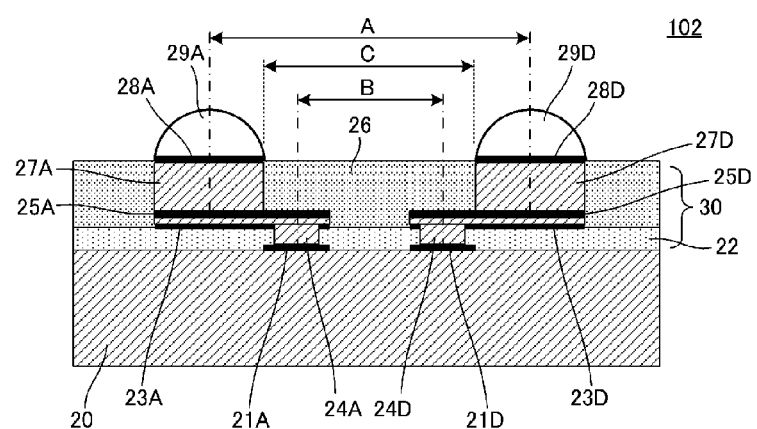
FIG. 8A is a cross-sectional view of the major portions of an ESD protection device 102 according to a second preferred embodiment of the present invention.
Figure 8B:
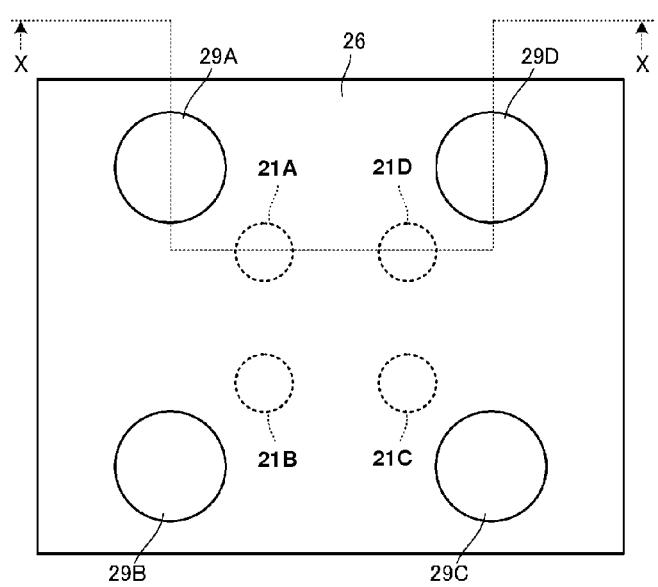
FIG. 8B is a plan view seen from the mounting surface side of the ESD protection device 102.

FIG. 8A is a cross-sectional view of the major portions of an ESD protection device 102 according to a second preferred embodiment of the present invention. FIG. 8B is a plan view seen from the mounting surface side of the device. FIG. 8A is a cross-sectional view taken along line X-X illustrated in FIG. 8B.

The ESD protection device 102 includes a semiconductor substrate 20 including input/output electrodes 21A and 21D and a rewiring layer 30 located on the top surface of the semiconductor substrate 20. Although not illustrated in FIG. 8A and FIG. 8B, an ESD protection circuit is provided in the top layer of the semiconductor substrate 20 and input/output electrodes (21A, 21D, and the like) are connected to the ESD protection circuit. The rewiring layer 30 includes interlayer wiring lines (24A, 24D, and the like), in-plane wiring lines (25A, 25D, and the like), and post-shaped electrodes (27A, 27D, and the like).

The cross-sectional structure illustrated in FIG. 8A is similar to that of the ESD protection device 101 described in the first preferred embodiment. However, in the second preferred embodiment, terminal electrodes (29A, 29D, and the like) preferably defined by solder bumps are located on terminal electrodes (28A, 28D, and the like). The post-shaped electrodes (27A, 27D, and the like) are preferably shaped like columns. In the second preferred embodiment, four terminal electrodes are provided and a two-channel ESD protection device is realized.

Figure 9:
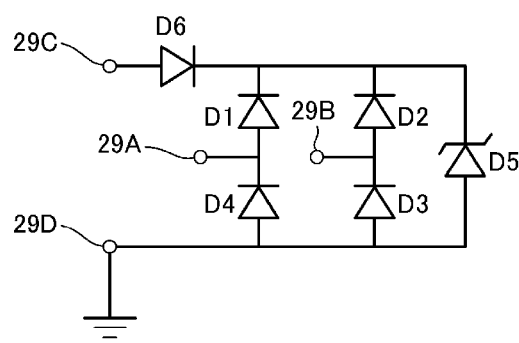
FIG. 9 is a circuit diagram of the ESD protection device 102.

FIG. 9 is a circuit diagram of the ESD protection device 102. Here, the terminal electrode 29C is a terminal connected to a power supply line, the terminal electrode 29D is a terminal connected to the ground, the terminal electrode 29A is a terminal connected to a first signal line, and the terminal electrode 29B is a terminal connected to a second signal line.

In this manner, a diode D1 is connected between the first signal line and the power supply line, and a diode D4 is connected between the first signal line and the ground. Similarly, a diode D2 is connected between the second signal line and the power supply line, and a diode D3 is connected between the second signal line and the ground. Further, a diode D5 is connected between the power supply line and the ground. A diode D6 is inserted in the power supply line in a reverse direction. Among these diodes, the diodes D1 to D5 allow surge currents that are input from the terminal electrodes 29A and 29B to pass therethrough as bypasses so as to cause the surge currents to flow to the power supply line or the ground.

The diode D5 is a Schottky barrier diode, and the rest of the diodes, D1 to D4 and D6, are PN junction diodes. Note that the diode D6 is provided to cut off currents flowing from the terminal electrodes 29A and 29B to the power supply line. The diodes D1 to D6 are preferably each provided in a plurality as necessary in accordance with the required current capacities.

Figure 10A:
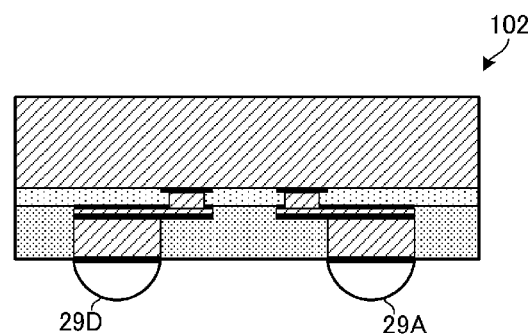
FIG. 10A illustrates the ESD protection device 102 and a configuration of a printed circuit board on which the ESD protection device 102 is to be mounted.
Figure 10A:
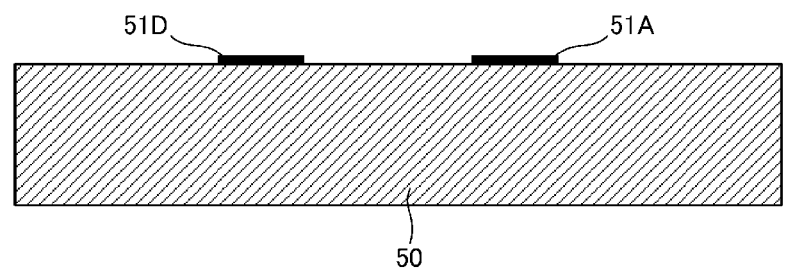
Figure 10B:
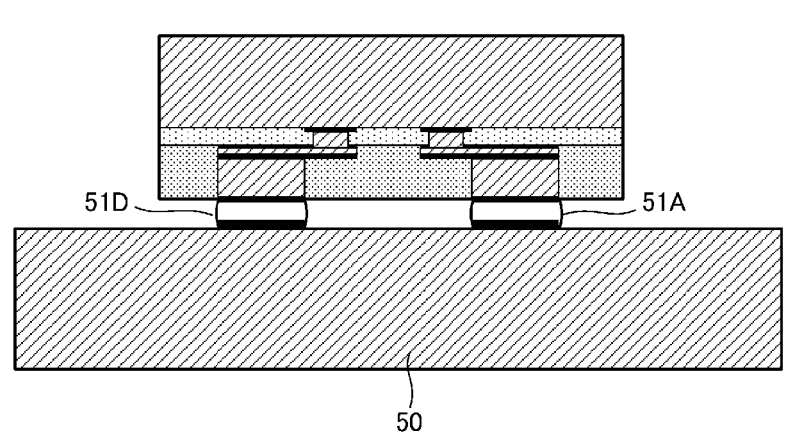
FIG. 10B illustrates a configuration in a state in which the ESD protection device 102 is mounted on the printed circuit board.

FIG. 10A illustrates the ESD protection device 102 and the configuration of a printed circuit board on which the ESD protection device 102 is to be mounted. FIG. 10B illustrates a configuration in a state in which the ESD protection device 102 is mounted on the printed circuit board.

Referring to FIG. 10A and FIG. 10B, the ESD protection device 102 is mounted and fixed to pad electrodes (51A, 51D, and the like) of a printed circuit board 50 using, for example, a reflow soldering method. The ESD protection device 102 is an example of the device that is a two-channel product, and has ESD protection capability for two signal lines.

Third Preferred Embodiment

Figure 11:
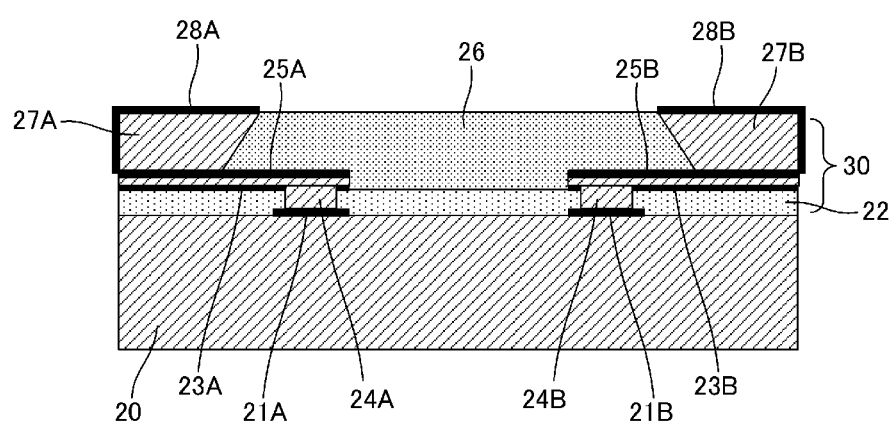
FIG. 11 is a cross-sectional view of the major portions of an ESD protection device 103 according to a third preferred embodiment of the present invention.

FIG. 11 is a cross-sectional view of the major portions of an ESD protection device 103 according to a third preferred embodiment of the present invention. In the ESD protection device 103, post-shaped electrodes 27A and 27B are exposed on the sides of the device, and terminal electrodes 28A and 28B defined by metal plating are located on the surfaces of the sides. In other words, the terminal electrodes 28A and 28B which continuously extend from the bottom surface (upper surface in the orientation illustrated in FIG. 11) to the side surfaces of the ESD protection device are provided.

By providing terminal electrodes having such configurations, when the ESD protection device 103 is mounted on a motherboard, solder extends to the side surfaces of the terminal electrodes 28A and 28B such that the contact areas between the solder and the terminal electrodes 28A and 28B are increased. As a result, the connection strength of the ESD protection device 103 is increased and it becomes easy to check the mounted state (soldered state).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   a semiconductor substrate including an ESD protection circuit and first and second input/output electrodes electrically connected to the ESD protection circuit; and
   a rewiring layer including a first post-shaped electrode electrically connected to the first input/output electrode and a first terminal electrode, and a second post-shaped electrode electrically connected to the second input/output electrode and a second terminal electrode; wherein
   a distance between centers of the first and second post-shaped electrodes is larger than a distance between centers of the first and second input/output electrodes.

2. The ESD protection device according to claim 1, wherein a minimum distance between the first and second post-shaped electrodes is larger than the distance between the centers of the first and second input/output electrodes.

3. The ESD protection device according to claim 1, wherein
the rewiring layer includes first and second in-plane wiring lines disposed within an inner layer and first and second interlayer wiring lines respectively connecting the first and second in-plane wiring lines to the first and second input/output electrodes;
the first post-shaped electrode connects the first in-plane wiring line to the first terminal electrode; and
the second post-shaped electrode connects the second in-plane wiring line to the second terminal electrode.

4. The ESD protection device according to claim 3, wherein each of cross-sectional areas of the first and second post-shaped electrodes in planes perpendicular or substantially perpendicular to center axes of the electrodes is larger on the terminal electrode side than on the input/output electrode side.

5. The ESD protection device according to claim 4, wherein the first and second post-shaped electrodes have shapes in which the cross-sectional areas thereof increase continuously or stepwise from the input output electrodes toward the terminal electrodes.

6. The ESD protection device according to claim 1, wherein
a first terminal electrode connected to a first signal line and a second terminal electrode connected to a second signal line are provided on the rewiring layer adjacent to two respective edge portions defined by a first side and third and fourth sides neighboring the first side of the semiconductor substrate;
a third terminal electrode connected to a power supply line and a fourth terminal electrode connected to a ground line are provided on the rewiring layer near adjacent to respective edge portions defined by a second side opposing the first side and third and fourth sides neighboring the second side of the semiconductor substrate; and
the ESD protection circuit is connected between the first terminal electrode and the third terminal electrode, between the first terminal electrode and the fourth terminal electrode, between the second terminal electrode and the third terminal electrode, and between the second terminal electrode and the fourth terminal electrode.

7. The ESD protection device according to claim 1, wherein the rewiring layer includes interlayer wiring lines, in-plane wiring lines, and the first and second post-shaped electrodes.

8. The ESD protection device according to claim 1, wherein the first and second terminal electrodes are rectangular or substantially rectangular.

9. The ESD protection device according to claim 1, wherein a surface of the ESD protection device on which the first and second terminal electrodes are mounted is rectangular or substantially rectangular.

10. The ESD protection device according to claim 1, further comprising a diode connected to the first and second input/output electrodes.

11. The ESD protection device according to claim 1, further comprising an insulating layer located on a surface of the semiconductor substrate on which the ESD protection circuit is located.

12. The ESD protection device according to claim 11, wherein the insulating layer includes holes where the first and second input/output electrodes are located.

13. The ESD protection device according to claim 11, wherein the rewiring layer includes in-plane wiring lines located on the insulating layer, and an insulating adhesive layer is located between the in-plane wiring lines and the insulating layer.

14. The ESD protection device according to claim 1, wherein the rewiring layer includes in-plane wiring lines and a maximum width of the first and second post-shaped electrodes is larger than a diameter of the first and second interlayer wiring lines.

15. The ESD protection device according to claim 1, wherein the first and second post-shaped electrodes are pillar-shaped or have a square cross-section.

16. The ESD protection device according to claim 1, wherein the first and second terminal electrodes include additional terminal electrodes disposed thereon.

17. The ESD protection device according to claim 1, further comprising a plurality of diodes connected to the first and second input/output electrodes, a power supply line and ground.

18. The ESD protection device according to claim 1, wherein the first and second post-shaped electrodes are exposed on sides of the ESD protection device.

19. The ESD protection device according to claim 18, wherein the first and second terminal electrodes are located the sides of the ESD protection device.

20. The ESD protection device according to claim 1, wherein the ESD protection device is one of a single-channel ESD protection device or a two-channel ESD protection device.

* * * * *